(12) United States Patent  (10) Patent No.: US 6,631,061 B2
Okawa  (45) Date of Patent: Oct. 7, 2003

(54) SEMICONDUCTOR INTEGRATED DEVICE

(75) Inventor: Kazuhiko Okawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 35 days.

(21) Appl. No.: 09/745,736

(22) Filed: Dec. 26, 2000

(65) Prior Publication Data

US 2001/0017754 A1 Aug. 30, 2001

(30) Foreign Application Priority Data

Dec. 24, 1999 (JP) .......................... 11-367009

(51) Int. Cl.[7] .................. H02H 9/00; H02H 3/22; H01L 29/73; H01L 23/62
(52) U.S. Cl. ................ 361/56; 361/56; 361/111; 257/174; 257/355
(58) Field of Search ............... 361/56, 54, 111, 361/91, 118, 91.1; 257/355, 174

(56) References Cited

U.S. PATENT DOCUMENTS 5,027,181 A * 6/1991 Larik et al. ............ 257/355
5,616,943 A * 4/1997 Nguyen et al. ......... 257/203
5,903,420 A * 5/1999 Ham .................... 257/355
6,144,542 A * 11/2000 Ker et al. .............. 361/111
6,400,542 B1 * 6/2002 Lee et al. .............. 361/111

FOREIGN PATENT DOCUMENTS

| JP | A-2-111046 | * | 4/1990 |
| JP | A-6-93497  | * | 4/1994 |
| JP | A-8-172188 | * | 7/1996 |

* cited by examiner

Primary Examiner—Stephen W. Jackson
Assistant Examiner—Danny Nguyen
(74) Attorney, Agent, or Firm—Oliff & Berridge, PLC

(57) ABSTRACT

A semiconductor integrated device is provided which consists of a plurality of circuit blocks. Each circuit block is connected to a power supply terminal and a ground terminal. Signal interface sections connect signal circuits among the circuit blocks. A plurality of first diodes are serially connected to one another in a first direction between the ground terminal of a first one of the circuit blocks and the ground terminal of another of the circuit blocks. A plurality of second diodes are serially connected to one another in a second direction that is opposite to the first direction between the ground terminal of the first circuit block and the ground terminal of the another circuit block.

6 Claims, 3 Drawing Sheets

SEMICONDUCTOR INTEGRATED DEVICE

BACKGROUND OF THE INVENTION

1. Field of Invention

The present invention relates to semiconductor integrated devices and, more particularly, to a semiconductor integrated device having a plurality of circuit blocks that respectively use a plurality of power supply sources.

2. Description of Related Art

In general, in a semiconductor integrated device including a plurality of circuit blocks, a power supply and a ground (ground potential) in each of the circuit blocks are isolated from each other to prevent noises generated in one of the circuit blocks from propagating to another circuit block. FIG. 6 shows an equivalent circuit of the semiconductor integrated device.

The semiconductor integrated device shown in FIG. 6 includes three circuit blocks 1, 2 and 3. The circuit block 1 connects to a power supply terminal $V_{DD}1$ and a ground terminal GND 1. The circuit block 2 connects to a power supply terminal $V_{DD}2$ and a ground terminal GND 2. The circuit block 3 connects to a power supply terminal $V_{DD}3$ and a ground terminal GND 3. A signal circuit between the circuit blocks 1 and 2 is connected by a signal interface S12. A signal circuit between the circuit blocks 2 and 3 is connected by a signal interface S23. The device has a structure in which the power supply and the grounding of the circuit blocks 1 through 3 are separated by metal wirings. Therefore, it is difficult with this structure for noises generated in one of the circuit blocks to propagate to another circuit block.

A high resistance of a semiconductor substrate exists between the grounds of the circuit blocks 1–3. Therefore, the semiconductor integrated device has a structure equivalent to the one shown in FIG. 6 in which substrate resistor R12 and R23, each having a high resistance value are connected between the grounds.

SUMMARY OF THE INVENTION

In the semiconductor integrated device shown in FIG. 6, for example, when electrostatic discharge of a high voltage is applied between the ground terminal GND1 of the circuit block 1 and the power supply terminal $V_{DD}2$ of the circuit block 2, a high voltage is applied to both ends of the signal interface S12 that connects the circuit blocks 1 and 2, due to the presence of the substrate resistor R12 of a high resistance value in a discharge route. As a result, a dielectric breakdown likely occurs, and a sufficient dielectric strength against electrostatic discharge is not attained.

Japanese patent No. HEI 6-93497 describes a complementary MIS integrated circuit having a plurality of independent circuit blocks, and bi-directional P-N junction diodes provided between power supply terminals and ground/power supply terminals of each of the respective circuit blocks, to thereby form discharge routes having a lower impedance than that of the substrate. However, in this circuit, a current starts flowing in a forward bias when a noise voltage of about 0.7V is applied to the diode. Therefore, the circuit does not provide a sufficient countermeasure against noises.

Japanese Laid-open patent application HEI 2-111046 describes an electrostatic discharge (ESD) protection circuit for a monolithic IC, in which a circuit having diodes in a forward bias and in an reversed bias that are connected in parallel with each other is connected between a plurality of power supply terminals. However, this circuit is aimed at protecting the IC from an abnormal voltage between a power supply terminal and the signal terminal or an abnormal voltage between the power supply terminals, and the circuit of parallel-connected diodes is not connected between the ground terminals. Also, when one power supply voltage is lower than another power supply voltage in a normal operation, a current flows in the diodes, possibly resulting in the damage of the IC or a power supply circuit.

Further, Japanese Laid-open patent application HEI 8-172188 describes a semiconductor device that includes a first protection circuit and a second protection circuit connected between terminals of a monitor transistor to be protected and either a power supply or a grounding. The first protection circuit has a plurality of diodes serially connected in one direction, and the second protection circuit has one or more diodes serially connected in a second direction. However, this publication does not describe a plurality of circuit blocks that respectively have independent power supply terminals and ground terminals.

In view of at least the above, it is an object of the present invention to at least provide a semiconductor integrated device which is provided with sufficient countermeasures against noises and electrostatic discharge.

In accordance with the exemplary embodiments of the present invention, a plurality of diodes are connected between ground terminals of a plurality of circuit blocks that are included in a semiconductor integrated device. A noise current does not flow unless a noise voltage that may be applied between the ground terminals exceeds at least a forward bias voltage of two of the diodes. On the other hand, when electrostatic discharge having a high voltage is applied between the ground terminals, the voltage is clamped through the plurality of diodes, with the result that the dielectric breakdown of a signal interface or the like is prevented.

In accordance with one exemplary embodiment of the present invention, a semiconductor integrated device may consist of:

N number of circuit blocks (N is an integer that is 2 or greater), each circuit block being connected to a power supply terminal and a ground terminal;

a signal interface unit that connects signal circuits among the N number of circuit blocks;

a plurality of first diodes serially connected to one another in a first direction between the ground terminal of a first one of the N number of circuit blocks and the ground terminal of a K-th one of the N number of circuit blocks (K=2, 3, . . . , N); and a plurality of second diodes serially connected to one another in a second direction that is opposite to the first direction between the ground terminal of the first circuit block and the ground terminal of the K-th circuit block.

In accordance with a second exemplary embodiment of the present invention, a semiconductor integrated device may consist of:

N number of circuit blocks (N is an integer that is 2 or greater), each circuit block being connected to a power supply terminal and a ground terminal;

a signal interface unit that connects signal circuits among the N number of circuit blocks;

a plurality of first diodes serially connected to one another in a first direction between the ground terminal of a K-th one of the N number of circuit blocks and the ground terminal of a (K+1)-th one of the N number of circuit blocks (K=1, 2, 3, . . . , N−1); and a plurality of second diodes serially connected to one another in a second direction that is opposite to the first direction between the ground terminal of the K-th circuit block and the ground terminal of the (K+1)-th circuit block.

Preferably, each of the N number of circuit blocks may have one diode or a plurality of serially connected diodes, each having a cathode connected to the power supply terminal and an anode connected to the ground terminal, Further, each of the N number of circuit blocks may further include a bipolar transistor having an emitter and a collector connected between the power supply terminal and the ground terminal and a base connected to one of the power supply terminal and the ground terminal through a Zener diode and connected to the other through a resistor.

In the semiconductor integrated device described above, the plurality of first diodes may include a diode having an anode electrode that is connected to a $P^+$ layer formed in a P well of the semiconductor integrated device and a cathode electrode that is connected to an $N^+$ layer formed in the P well. Also, the plurality of second diodes may include a diode having an anode electrode that is connected to a $P^+$ layer formed in an N well of the semiconductor integrated device and a cathode electrode that is connected to an $N^+$ layer formed in the N well, wherein the $P^+$ layer formed in the P well and the $N^+$ layer formed in the N well may be connected to each other.

With the structure described above, a plurality of diodes are connected between ground terminals of a plurality of circuit blocks in a semiconductor integrated device. As a result, a noise current does not flow unless a noise voltage applied between the ground terminals exceeds a voltage in a forward bias provided by at least two of the diodes combined. On the other hand, when a high voltage of electrostatic discharge is applied between the ground terminals, the voltage is clamped through the plural diodes, and therefore the dielectric breakdown of the signal interface is prevented.

DETAILED DESCRIPTION OF PREFERRED EMBODIMENTS

Exemplary embodiments of the present invention will be described with reference to the accompanying drawings. It is noted that the same elements are referred to by the same reference numbers, and the description thereof is omitted.

Figure 1:
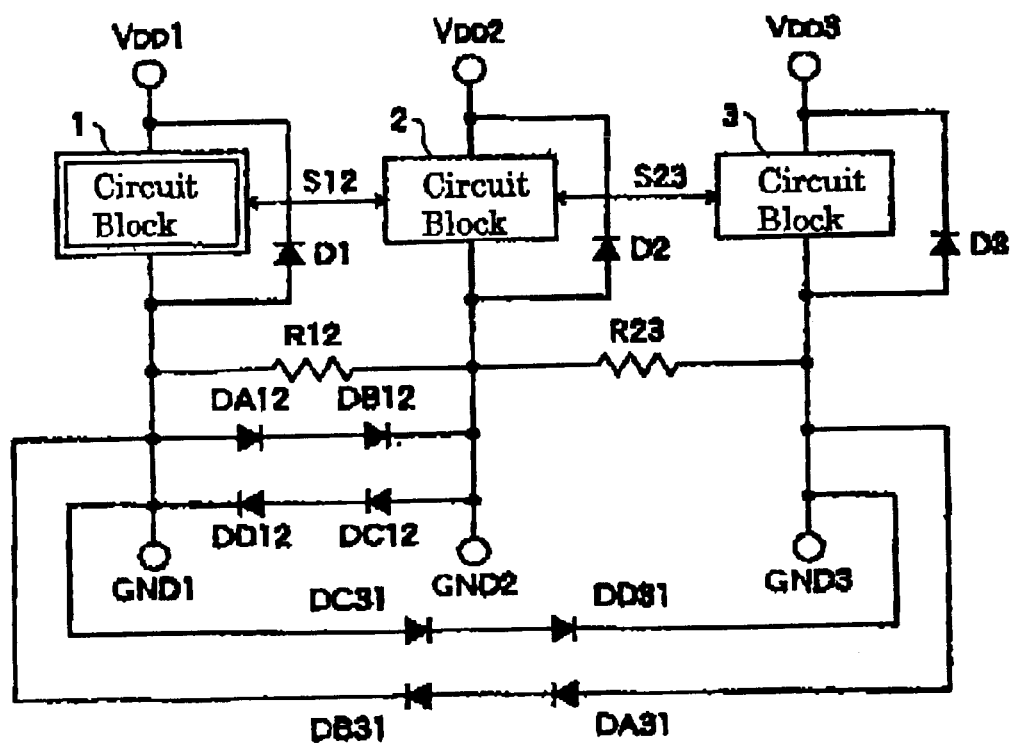
FIG. 1 shows a structure of a semiconductor integrated device in accordance with a first exemplary embodiment of the present invention.

FIG. 1 shows a structure of a semiconductor integrated device in accordance with a first exemplary embodiment of the present invention. The present invention is applicable to a semiconductor integrated device including N number of circuit blocks (N being two or more). In the present embodiment, the semiconductor integrated device includes three circuit blocks 1, 2 and 3.

The circuit block 1 connects to a power supply terminal $V_{DD}1$ and a ground terminal GND 1. The circuit block 2 connects to a power supply terminal $V_{DD}2$ and a ground terminal GND 2. The circuit block 3 connects to a power supply terminal $V_{DD}3$ and a ground terminal GND 3.

A signal circuit between the circuit blocks 1 and 2 is connected by a signal interface S12. A signal circuit between the circuit blocks 2 and 3 is connected by a signal interface S23. The device has a structure in which the power supply and the grounding of the circuit blocks 1 through 3 are separated by metal wirings. Accordingly, it is difficult with this structure for noises generated in one of the circuit blocks to propagate to another circuit block.

When the circuit block 1 has a largest area, electrostatic discharge may preferably be discharged through the ground terminal of the circuit block 1. In this connection, a plurality of diodes are used to centrally connect the ground terminal of the circuit block 1 to the ground terminals of the other circuit blocks. In other words, diodes DA12 and DB12 serially connected in a first direction and diodes DC12 and DD12 serially connected in a second direction opposite to the first direction are connected between the ground terminal GND 1 of the circuit block 1 and the ground terminal GND 2 of the circuit block 2. Also, diodes DA31 and DB31 serially connected in the second direction and diodes DC31 and DD31 serially connected in the first direction are connected between the ground terminal GND 1 of the circuit block 1 and the ground terminal GND 3 of the circuit block 3. The pairs of the diodes connected in this manner are called bi-directional diodes.

A plurality of diodes (two diodes in this embodiment) are serially connected in a manner described above for the following reasons. A forward bias voltage of one diode is about 0.7V. Therefore, if there is only one diode, a current starts flowing between the grounds when a noise voltage reaches about 0.7V. Therefore, one diode is not enough to shut out noises. However, when two diodes are serially connected, a current does not flow between the grounds until a noise voltage reaches about 1.5V. Accordingly, noises can be sufficiently shut out.

It is noted that, in FIG. 1, bi-directional diodes are not connected between the grounds of the circuit blocks 2 and 3. However, this does not cause any problems because they are connected by the bi-directional diodes between the ground terminals of the circuit blocks 2 and 1 and the bi-directional diodes between the ground terminals of the circuit blocks 1 and 3.

Preferably, protection diodes D1–D3 are provided for the respective circuit blocks 1–3. For example, for the circuit block 1, its power supply terminal $V_{DD}1$ is connected to a cathode of the protection diode D1, and its ground terminal GND1 is connected to an anode of the protection circuit D1. By this, electrostatic discharge is readily discharged from the ground terminal to the power supply terminal.

Figure 2A:
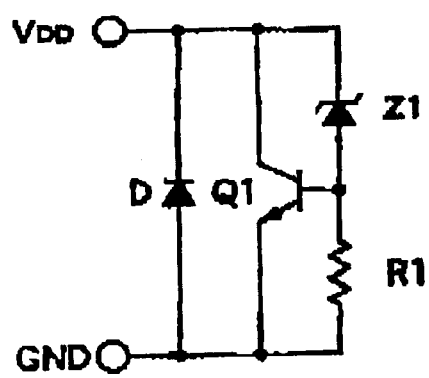
FIG. 2(a) shows a structure in which an NPN transistor and a protection diode are connected in parallel with each other in the semiconductor integrated device of the first exemplary embodiment of the present invention.
Figure 2B:
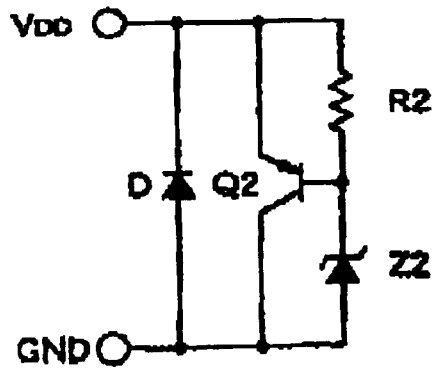
FIG. 2(b) shows a structure in which a PNP transistor and a protection diode are connected in parallel with each other in the semiconductor integrated device of the first embodiment.

Moreover, as shown in FIG. 2(a) or FIG. 2(b), a bipolar transistor may preferably be connected in parallel with the protection diode D for each of the circuit blocks. FIG. 2(a)

shows an example in which an NPN transistor Q1 is connected. A Zener diode Z1 is connected between the power supply terminal $V_{DD}$ and a base of the NPN transistor Q1, and a resistor R1 is connected between the base of the NPN transistor Q1 and the ground terminal GND. FIG. 2(b) shows an example in which a PNP transistor Q2 is connected. A resistor R2 is connected between a base of the PNP transistor Q2 and the power supply terminal $V_{DD}$, and a Zener diode Z2 is connected between the base of the PNP transistor Q2 and the ground terminal GND. When a voltage between the base and the emitter of the bipolar transistor reaches a predetermined level, the bipolar transistor turns on, and electrostatic discharge is discharged from the power supply terminal $V_{DD}$ to the ground terminal GND.

Figure 3:
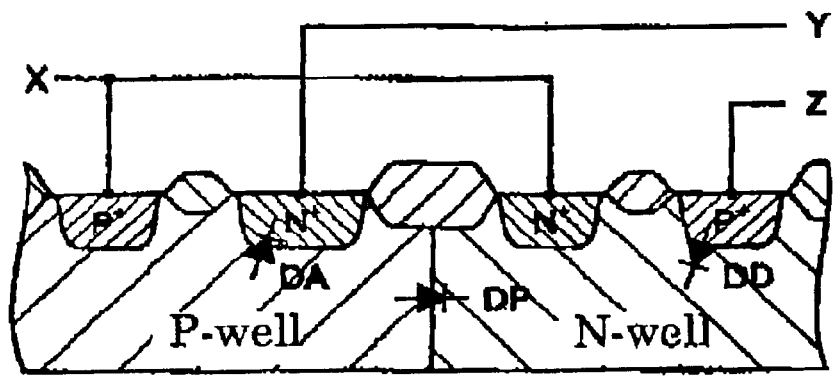
FIG. 3 shows a partial cross section of a bi-directional diode formed in the semiconductor integrated device of the first exemplary embodiment of the present invention.
Figure 4:
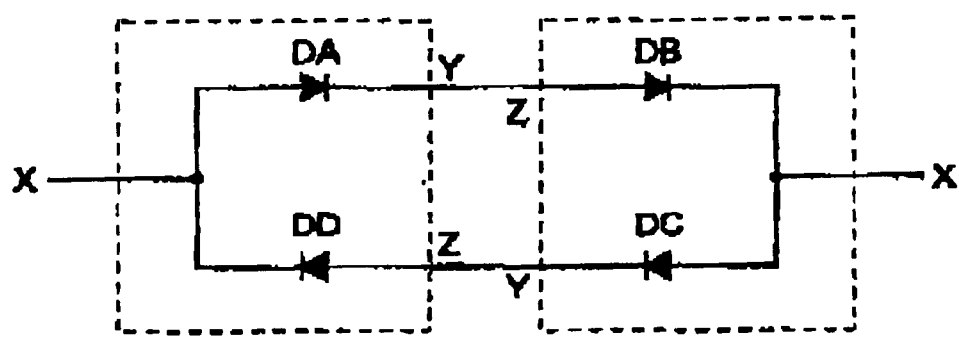
FIG. 4 shows a state in which two pairs of the bi-directional diodes shown in FIG. 3 are connected.

FIG. 3 shows a cross section in part of a bi-directional diode formed in a semiconductor integrated device in accordance with one exemplary embodiment of the present invention. The semiconductor integrated device has a P well in which a $P^+$ layer and an $N^+$ layer are formed, and has a PN junction at a boundary between the P well and the $N^+$ layer. To use this structure as a diode DA, an anode electrode X is connected to the $P^+$ layer, and a cathode electrode Y is connected to the $N^+$ layer. The semiconductor integrated device also has an N well in which an $N^+$ layer and a $P^+$ layer are formed, and has a PN junction at a boundary between the $P^+$ layer and the N well. To use this structure as a diode DD, an anode electrode Z is connected to the $P^+$ layer, and a cathode electrode X is connected to the $N^+$ layer. It is noted that a parasitic diode DP is present between the diode DA and the diode DD. However, as shown in FIG. 3, the anode electrode of the diode DA and the cathode electrode of the diode DD are commonly connected with each other, such that the diodes DA and DD are used as a bi-directional pair. As a result, the parasitic diode DP does not have any effect on the structure. As shown in FIG. 4, two bi-directional pairs of this type are used to form four diodes DA, DB, DC and DD that are connected between the ground terminals of the two circuit blocks.

Figure 5:
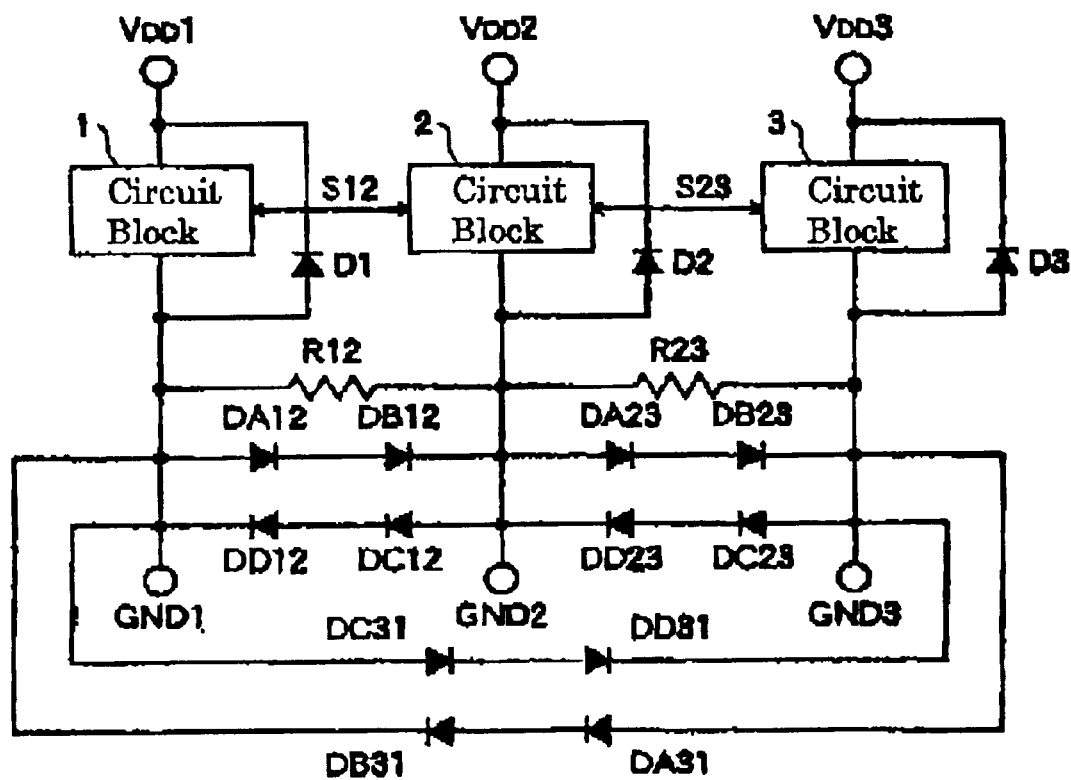
FIG. 5 shows a structure of an semiconductor integrated device in accordance with a second exemplary embodiment of the present invention.
Figure 6:
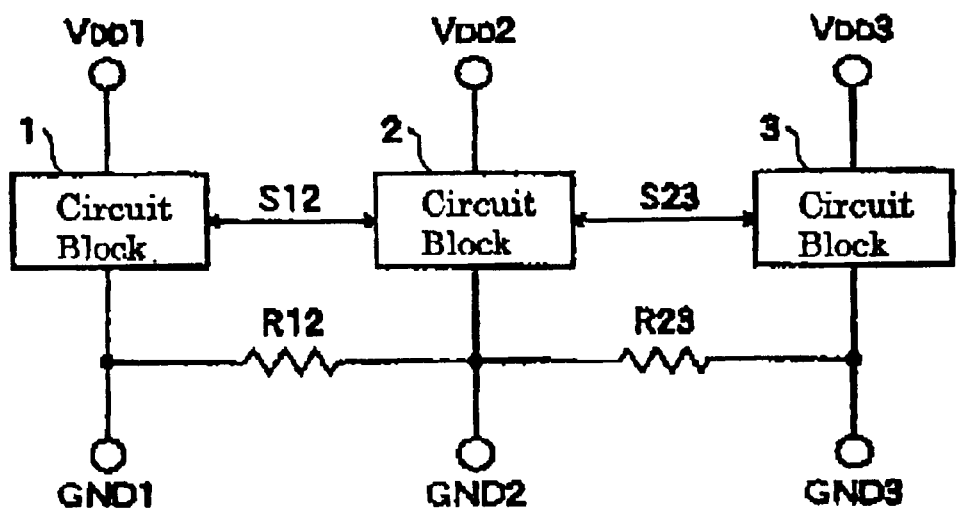
FIG. 6 shows an equivalent circuit of a semiconductor integrated device.

Next, a second exemplary embodiment of the present invention is described with reference to FIG. 5. In the second exemplary embodiment, bi-directional diodes are used to connect a plurality of circuit blocks in a ring shape. When the number of circuit blocks within a semiconductor integrated device increases, the localized connection described with reference to the first exemplary embodiment may become difficult. For example, when a semiconductor integrated device includes ten circuit blocks, one of the circuit blocks having the largest area needs to be connected to the remaining nine circuit blocks. In such a case, the ring-shape connection of the second embodiment is more advantageous.

In accordance with the present embodiment, diodes DA12 and DB12 that are serially connected in a first direction and diodes DC12 and DD12 that are serially connected in a second direction opposite to the first direction are connected between the ground terminal GND1 of the circuit block 1 and the ground terminal GND2 of the circuit block 2. Also, diodes DA23 and DB23 that are serially connected in the first direction and diodes DC23 and DD23 that are serially connected in the second direction are connected between the ground terminal GND2 of the circuit block 2 and the ground terminal GND3 of the circuit block 3. Furthermore, diodes DA31 and DB31 that are serially connected in the second direction and diodes DC31 and DD31 that are serially connected in the first direction are connected between the ground terminal GND3 of the circuit block 3 and the ground terminal GND1 of the circuit block 1.

With the structure described above, even when electrostatic discharge of a high voltage is applied between two of the adjacent circuit blocks, a potential difference between the two ground terminals is always clamped with a forward bias voltage of two of the diodes.

What is claimed is:

1. A semiconductor integrated device, comprising:
    N number of circuit blocks, where N is an integer that is 2 or greater, each circuit block being connected to a respective one of a plurality of power supply terminals and a respective one of a plurality of ground terminals;
    a plurality of signal interface units, each signal interface unit connecting a pair of circuit blocks among the N number of circuit blocks to form a signal circuit between the respective pair of circuit blocks;
    a plurality of first diodes serially connected to one another in a first direction between the ground terminal of a first one of the N number of circuit blocks and the ground terminal of a K-th one of the N number of circuit blocks where K is an integer from 2 to N; and
    a plurality of second diodes serially connected to one another in a second direction that is opposite to the first direction between the ground terminal of the first circuit block and the ground terminal of the K-th circuit block.

2. The semiconductor integrated device according to claim 1, each of the N number of circuit blocks comprising one diode or a plurality of serially connected diodes, and each of diodes having a cathode connected to the power supply terminal and an anode connected to the ground terminal.

3. The semiconductor integrated device according to claim 2, each of the N number of circuit blocks further comprising a bipolar transistor having an emitter and a collector connected between the power supply terminal and the ground terminal and a base connected to one of the power supply terminal and the ground terminal through a Zener diode and connected to another of the power supply terminal and the ground terminal through a resistor.

4. A semiconductor integrated device, comprising:
    N number of circuit blocks, where N is an integer that is 2 or greater, each circuit block being connected to a respective one of a plurality of power supply terminals and a respective one of a plurality of ground terminals;
    a plurality of signal interface units, each signal interface unit connecting a pair of circuit blocks among the N number of circuit blocks to form a signal circuit between the respective pair of circuit blocks;
    a plurality of first diodes serially connected to one another in a first direction between the ground terminal of a K-th one of the N number of circuit blocks and the ground terminal of a (K+1)-th one of the N number of circuit blocks, where K is an integer from 1 to N, and when the K-th circuit block is an N-th circuit block, the (K+1)-th circuit block is a first circuit block; and
    a plurality of second diodes serially connected to one another in a second direction that is opposite to the first direction between the ground terminal of the K-th circuit block and the ground terminal of the (K+1)-th circuit block.

5. The semiconductor integrated device according to claim 4, each of the N number of circuit blocks comprising one diode or a plurality of serially connected diodes, and each of diodes having a cathode connected to the power supply terminal and an anode connected to the ground terminal.

6. The semiconductor integrated device according to claim 5, each of the N number of circuit blocks further comprising a bipolar transistor having an emitter and a collector connected between the power supply terminal and the ground terminal and a base connected to one of the power supply terminal and the ground terminal through a Zener diode and connected to another of the power supply terminal and the ground terminal through a resistor.

* * * * *